(12) United States Patent
Nagel et al.

(10) Patent No.: US 10,680,147 B2
(45) Date of Patent: Jun. 9, 2020

(54) METHOD OF PRODUCING A LIGHTING DEVICE

(71) Applicant: OSRAM OLED GmbH, Regensburg (DE)

(72) Inventors: Peter Nagel, Regensburg (DE); Klaus Reingruber, Langquaid (DE)

(73) Assignee: OSRAM Oled GmbH, Regensburg (DE)

(*) Notice: Subject to any disclaimer, the term of this patent is extended or adjusted under 35 U.S.C. 154(b) by 0 days.

(21) Appl. No.: 16/193,308

(22) Filed: Nov. 16, 2018

(65) Prior Publication Data
US 2019/0189871 A1    Jun. 20, 2019

(30) Foreign Application Priority Data
Nov. 24, 2017  (DE) .................. 10 2017 127 828

(51) Int. Cl.
| H01L 33/58 | (2010.01) |
| H01L 33/62 | (2010.01) |
| H01L 33/56 | (2010.01) |
| H01L 33/50 | (2010.01) |
| H01L 33/52 | (2010.01) |

(52) U.S. Cl.
CPC ............ *H01L 33/58* (2013.01); *H01L 33/504* (2013.01); *H01L 33/52* (2013.01); *H01L 33/56* (2013.01); *H01L 33/62* (2013.01); *H01L 2933/0025* (2013.01); *H01L 2933/0033* (2013.01); *H01L 2933/0091* (2013.01)

(58) Field of Classification Search
CPC ....... H01L 33/58; H01L 33/52; H01L 33/504; H01L 33/56; H01L 33/62; H01L 2933/0025; H01L 2933/0091; H01L 2933/0033
See application file for complete search history.

(56) References Cited

U.S. PATENT DOCUMENTS

| 2008/0254650 A1 | 10/2008 | Kadotani et al. |
| 2009/0200567 A1 | 8/2009 | Yoon |
| 2015/0108511 A1 | 4/2015 | Illek |
| 2015/0194583 A1* | 7/2015 | Sabathil ............ H01L 31/02322 257/98 |

FOREIGN PATENT DOCUMENTS

| DE | 10 2012 209 325 A1 | 12/2013 |
| JP | 2010-157638 A | 7/2010 |

OTHER PUBLICATIONS

German Search Report dated Aug. 28, 2018, of corresponding German Application No. 10 2017 127 828.1.
German Search Report dated Jul. 22, 2019, of counterpart German Application No. 10 2018 129 191.4.

* cited by examiner

*Primary Examiner* — Kyoung Lee
(74) *Attorney, Agent, or Firm* — DLA Piper LLP (US)

(57) ABSTRACT

A method of producing a lighting device includes a radiation-emitting optoelectronic component, including: arranging the component on a carrier, applying a first layer on the carrier, wherein the first layer surrounds the component at least laterally in the form of a circumferential frame, and subsequently applying a second layer on the first layer laterally next to the frame, wherein the second layer includes a greater hardness than the first layer.

20 Claims, 11 Drawing Sheets

METHOD OF PRODUCING A LIGHTING DEVICE

TECHNICAL FIELD

This disclosure relates to a method of producing a lighting device and a lighting device comprising a radiation-emitting component.

BACKGROUND

It is known to provide a lighting device comprising a radiation-emitting component, wherein the component is embedded in a mold material. There is nonetheless a need to provide a method for an improved lighting device comprising a radiation-emitting component and an improved lighting device comprising a radiation-emitting component.

SUMMARY

We provide a method of producing a lighting device including a radiation-emitting optoelectronic component, including arranging the component on a carrier, applying a first layer on the carrier, wherein the first layer surrounds the component at least laterally in the form of a circumferential frame, and subsequently applying a second layer on the first layer laterally next to the frame, wherein the second layer includes a greater hardness than the first layer.

We also provide a lighting device including a radiation-emitting optoelectronic component, wherein the component is arranged on a carrier, a first layer is arranged on the carrier, the first layer surrounds the component as far as a top side of the component in the form of a frame, a second layer is arranged laterally with respect to the frame on the first layer, and the second layer includes a greater hardness than the first layer.

Figure 1:
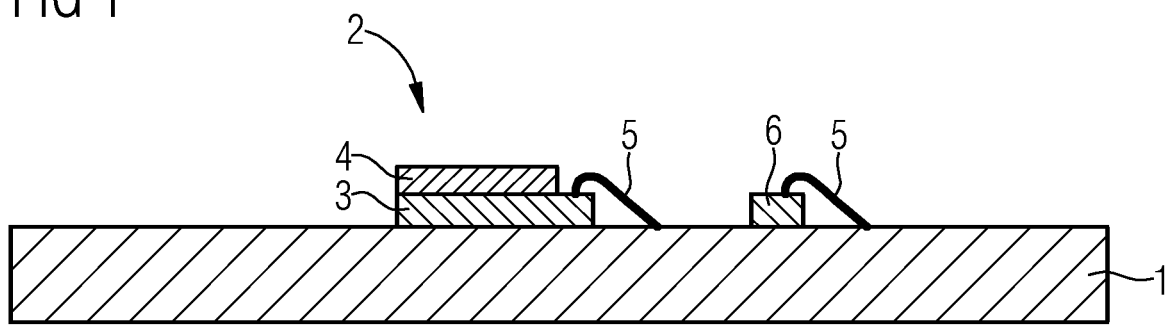
FIGS. 1 to 7 show a first method of producing a lighting device.

LIST OF REFERENCE SIGNS 1 carrier
2 component
3 semiconductor chip
4 conversion element
5 contact wire
6 protective diode
7 protective layer
8 first layer
9 plate
10 film
11 frame
12 free space
13 second layer
14 radiation surface
15 width
16 trench
17 third layer
18 second frame

DETAILED DESCRIPTION

One advantage of our methods and our lighting devices is that a lighting device comprising a radiation-emitting optoelectronic component is provided with the aid of our method, wherein the lighting device comprises better mechanical and/or optical properties. This is achieved by the fact that a radiation-emitting optoelectronic component is arranged on a carrier and a first layer is applied on the carrier. The first layer surrounds the component at least laterally in the form of a circumferential frame. A second layer is subsequently applied on the first layer laterally next to the frame. The second layer comprises a greater hardness than the first layer. The second layer thus ensures that a stable mechanical housing is provided for the component. The first layer may comprise a greater optical density than the second layer. In this example, the first layer may ensure that a frame that greatly scatters or reflects electromagnetic radiation is provided in a manner adjoining the component and circumferentially around the component. A boundary between a radiation surface of the component and a non-radiative and dark surrounding region may thus be achieved within a short path. Since the first layer laterally surrounds the component, rays emerging laterally from the component may also be well blocked. By way of example, a matrix material with scattering particles may be used as a material for the first layer. The matrix material used may be silicone, for example, which is filled with scattering particles such as titanium oxide, for example. By way of example, the degree of filling with the scattering particles may be 10 to 70 percent by weight.

Before applying the second layer, a third layer may be applied on the first layer. In this example, the frame of the first layer is surrounded at least laterally in the form of a circumferential second frame comprising the material of the third layer at the level of a top side of the component. Afterward, in a manner laterally adjoining the second frame, the second layer is applied on the third layer. The third layer comprises a material comprising a lower transmissivity to the electromagnetic radiation of the component than the material of the first layer. By way of example, the third layer is constituted of a black material that transmits substantially no electromagnetic radiation of the component. Consequently, propagation of the electromagnetic radiation in a lateral direction may be limited to the frame of the first layer. A precise delimitation of the radiating surface is achieved as a result.

The first layer may be applied, for example, over the whole area, anisotropically and with uniform layer thickness on the carrier and in an adjoining manner in the form of the frame on the component. In this example, the first layer may comprise a layer thickness of 30 μm to 600 μm. By way of example, the first layer may be applied with the aid of a jet method, a spray method or a casting method. Moreover, the first layer may also be applied on the component. The first layer may be precured or cured before applying the second layer.

The second layer may be applied on the first layer and in a manner adjoining the frame with the aid of a mold method. For this purpose, a plate may be placed onto the component, wherein the interspace between the plate and the first layer is filled with the second layer. The mold method used may be a film assisted mold method, for example. Moreover, the mold method may be used to achieve a curing of both the first layer and the second layer at the customary process temperatures of approximately 150° C. Before applying the second layer, the first layer may be cured or gelled to an extent such that the first layer does not float away during the process of introducing the second layer, but still bonds or adhesively bonds to the second layer.

By way of example, a silicone-glass composite material comprising a greater hardness than the first layer may be used as a material for the second layer. Instead of glass particles, it is also possible to use particles comprising other materials that are sufficiently optically transmissive to the radiation of the component and bring about a desired hardness of the second layer. Moreover, the first layer comprises a greater optical density than the second layer. The hardness may differ at least by 10% between the first and second layers. Moreover, in particular the optical density may differ at least by 10% between the first and second layers. The greater the hardness of the second layer, the greater the hardness of the housing. A robust housing to withstand mechanical loadings of the component may be produced as a result. The greater the optical density of the first layer, the less radiation is radiated laterally next to the top side of the component, i.e., the radiation surface. A greater fall-off in radiation power laterally next to the component is thus achieved. The component may be configured, for example, as a light-emitting diode. Moreover, the second layer may be constituted of a black material comprising a low or no optical transmissivity to the radiation of the component. The second layer may consist, e.g., of a blackened silicone and/or a blackened epoxy or a black plastic.

After applying the third layer, a plate may be placed onto the component. Afterward, an interspace between the plate and the third layer is filled with a molding material with the aid of a mold method and the second layer is formed.

The third layer is applied on a top side of the component or on a top side of a protective layer and on a top side of the frame of the first layer. As a result of placing the plate, the third layer is displaced from the top side of the component or from the top side of the protective layer and from the top side of the frame of the first layer at least partly, in particular completely, into an edge region laterally next to the frame of the first layer and a second frame is formed from the material of the third layer. A simple method of forming the second circumferential frame is provided as a result.

Before applying the first layer, a protective layer may be applied on a top side of the component. The protective layer may be removed again either after applying the first layer or after applying the second layer. Abrasive, solvent-based or caustic methods such as, e.g., milling methods, grinding processes or etching methods may be used to remove the protective layer. The protective layer may, for example, comprise a photoresist or consist of a photoresist. Moreover, the protective layer may comprise silicone or consist of silicone.

Furthermore, in the absence of a protective layer on the top side of the component, the top side of the component may also be covered with the first layer. The first layer may be at least partly or completely removed from the top side of the component before or after applying the second layer. This may be achieved, for example, by pressing the plate onto the top side of the component such that the first layer is displaced as far as possible completely or at least partly from the top side of the component and is squeezed onto the edge region of the component. As a result, it is possible to achieve an increase in the diameter of the frame in a plane of the top side of the component. Consequently, with relatively little material of the first layer it is possible to form a relatively wide frame around the component.

Moreover, the first layer may be removed above the component or above the protective layer with the aid of milling methods, grinding processes or cutting methods to obtain a transparent coupling-out face with relatively few scattering particles or without scattering particles.

The component may comprise contact wires, wherein the contact wires are covered by the first layer during the process of applying the first layer. By way of example, the contact wires are completely covered by the first layer. Moreover, an electrical circuit, e.g., a protective diode, may be formed on the carrier. The electrical circuit is likewise covered, in particular completely, by the first layer during the process of applying the first layer.

The component may comprise only one semiconductor chip configured to generate electromagnetic radiation. The semiconductor chip may be configured, for example, in the form of a light-emitting diode. Moreover, the component may comprise a semiconductor chip and a conversion element. The conversion element may be arranged on the semiconductor chip and constitute at least one part of the top side of the component.

The conversion element may be configured, for example, in the form of a ceramic with phosphor. The conversion element is configured to shift the wavelength of at least part of the radiation emitted by the semiconductor chip. By way of example, the conversion element may be configured to convert blue light at least partly into yellow light.

The first layer may comprise a thickness of 30 µm and 600 µm, in particular a thickness of 100 µm and 300 µm. Experiments have shown that with these layer thicknesses a sufficiently wide frame is formed around the component. Moreover, this layer thickness is sufficient to cover contact wires and/or further electrical circuits such as, for example, a protective diode with the first layer.

The first layer may comprise a matrix material, in particular silicone, and scattering particles. By forming the first layer with a matrix material and scattering particles, it is possible to produce an optically dense layer using simple means. By way of example, the scattering particles may comprise 10 percent by weight or up to 70 percent by weight of the first layer. Consequently, a highly filled first layer is provided which is optically dense and scatters or reflects a high proportion of radiation of the component. Consequently, the light of the component is radiated substantially only via the free top side of the component and not laterally. A very precise delimitation of the radiation surface of the component is achieved as a result.

At least in a circumferential edge region adjoining the top side of the semiconductor chip, a trench may be introduced into the first layer. In this examiner, in particular, a waterjet with plastic beads may be used. The trench additionally increases the contrast since less radiation is emitted laterally. A jump in refractive index between the component, in particular between the conversion element, and the surroundings is achieved as a result of the trench.

The carrier may be constituted of, for example, a ceramic, a leadframe, in particular a copper leadframe, or an all-copper carrier.

The lighting device has the advantage that the radiation surface of the component is precisely defined. This is achieved by the fact that the component is surrounded laterally by a frame comprising the first layer. The first layer comprises a high optical density. Moreover, the lighting device comprises a robust housing. This is achieved by the fact that a second layer is arranged on the first layer, wherein the second layer comprises a greater hardness than the first layer.

The frame may project beyond a top side of the component. A definition of the radiation surface with further precision may be achieved as a result.

The first layer may comprise a matrix material and scattering particles. Moreover, the second layer is constituted from a mold material. Formation of the first layer from a matrix material with scattering particles enables simple and reliable production of an optically dense layer. Since the frame laterally encompasses the component, a lateral propagation of the electromagnetic radiation emitted by the optoelectronic component is scattered within the frame and radiation in a lateral radiation direction is thus significantly reduced. Formation of the second layer from a mold material enables reliable production of the second layer, wherein the second layer may be formed with a relatively great hardness. By way of example, silicone with glass particles is used as a molding material.

The component may comprise a semiconductor chip and a conversion element. The conversion element is arranged on the top side of the semiconductor chip and covers at least one part of the top side of the semiconductor chip. The conversion element is likewise surrounded laterally by the frame. Electromagnetic radiation emitted laterally by the conversion element may thus be scattered or reflected by the frame such that the radiation in the radiation direction is delimited laterally in a manner narrowly delimited to the radiation surface of the semiconductor chip or the radiation surface of the conversion element. With the arrangement described, it is also possible to provide a component comprising a semiconductor chip and comprising a conversion element with a precisely defined radiation surface.

Experiments have shown that a width of the frame in the plane of the top side of the component of 30 μm to 600 μm, in particular 100 μm to 300 μm, is sufficient to obtain a precisely defined radiation surface. A matrix material, e.g., silicone, with a filling of scattering particles comprising, e.g., titanium oxide in an amount of 10 to 70 percent by weight may be used to form the first layer. The higher the proportion of scattering particles, the higher the optical density of the first layer.

The frame may comprise a substantially constant width proceeding from the carrier as far as the top side of the component. The width of the frame proceeding from the top side of the carrier may increase in the direction of the top side of the component, in particular increase in width by at least 10%. In this way, a relatively wide frame may be provided with little material outlay for the first layer in the region of the top side of the component. The wider the frame, the better the damping of the radiation in a lateral direction. The higher the optical density of the first layer, the better the damping of the electromagnetic radiation in the frame.

The above-described properties, features and advantages and the way in which they are achieved will become clearer and will be more clearly understood in association with the following description of examples explained in greater detail in association with the drawings.

FIG. 1 shows a schematic cross section through a carrier 1, on which an optoelectronic component 2 is arranged. The optoelectronic component 2 is configured to emit electromagnetic radiation. By way of example, the optoelectronic component is configured in the form of a semiconductor chip 3, on the top side of which a conversion element 4 is arranged. The conversion element 4 is configured to shift a wavelength of electromagnetic radiation of the semiconductor chip 3. The conversion element 4 may be configured, for example, in the form of a ceramic lamina with phosphor. The semiconductor chip 3 may be configured, for example, in the form of a light-emitting diode. The conversion element 4 may also be dispensed with.

In the example illustrated, the semiconductor chip 3 is supplied with power by at least one contact wire 5. However, the semiconductor chip may also be operated in the so-called flip-chip method, which manages without a contact wire. The contact wire 5 is connected to electrical lines (not illustrated) arranged on the carrier 1. The contact wire 5 may be dispensed with. In this example, electrical contacting of the semiconductor chip 3 may be carried out, for example, via contacts on the underside of the semiconductor chip 3 with corresponding electrical conduction tracks of the carrier 1. Moreover, in the example illustrated, the carrier 1 comprises an electrical circuit in the form of a protective diode 6. The protective diode 6 is likewise electrically conductively connected to electrical lines of the carrier 1 and/or to the component 2 via a contact wire 5. The protective diode 6 or electrical circuits may be dispensed with. Moreover, a plurality of components 2 may be arranged on the carrier 1.

Figure 2:
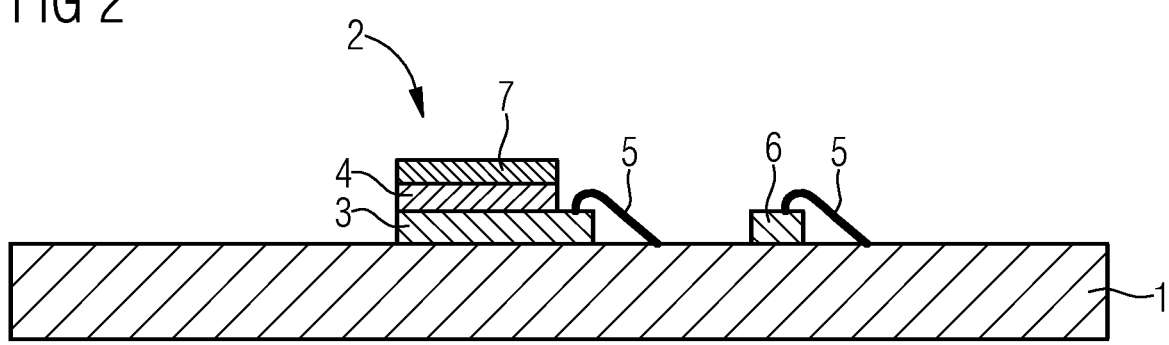

FIG. 2 shows a further method step, wherein a protective layer 7 is applied on the top side of the component 2. If the conversion element 4 is present, the protective layer 7 is applied on the conversion element 4. If the conversion element 4 is dispensed with, then the protective layer 7 is applied directly on the top side of the semiconductor chip 3. The protective layer 7 may, for example, comprise silicone or be constituted of silicone. Moreover, the protective layer 7 may, for example, comprise a photoresist or be constituted of a photoresist. The protective layer 7 covers the top side of the conversion element 4 at least in part, in particular in its entirety. Consequently, the protective layer 7 covers a desired radiation surface of the component 2. The protective layer is configured to protect the light-emitting top side of the component vis à vis contamination or reflective particles. The method step in accordance with FIG. 2 may optionally also be dispensed with.

Figure 3:
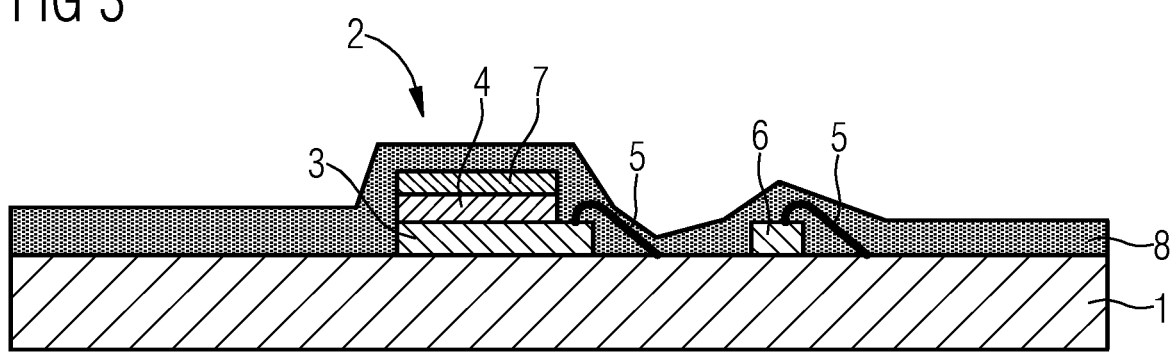

FIG. 3 shows a further method step, wherein a first layer 8 is applied on the carrier 1, the component 2 and the protective diode 6. The contact wires 5 may also be covered completely by the first layer 8. The first layer 8 may, for example, consist of a matrix material filled with scattering particles. By way of example, silicone or epoxy material may be used as matrix material and titanium oxide particles may be used as scattering particles. Moreover, at least 10 to 70 percent by weight of the first layer may consist of the scattering particles. The component 2 is covered with the first layer 8 either only laterally or both laterally and on the protective layer 7. The first layer 8 may comprise a soft consistency. The first layer 8 may be applied, for example, by spraying, jetting, casting or powder coating. The first layer 8 may also be applied by a screen printing method. With the aid of the screen printing method, e.g., the concentration by weight of the scattering particles, in particular of titanium oxide particles, in the first layer 8 may be increased to up to 90 percent by weight or more.

Figure 4:
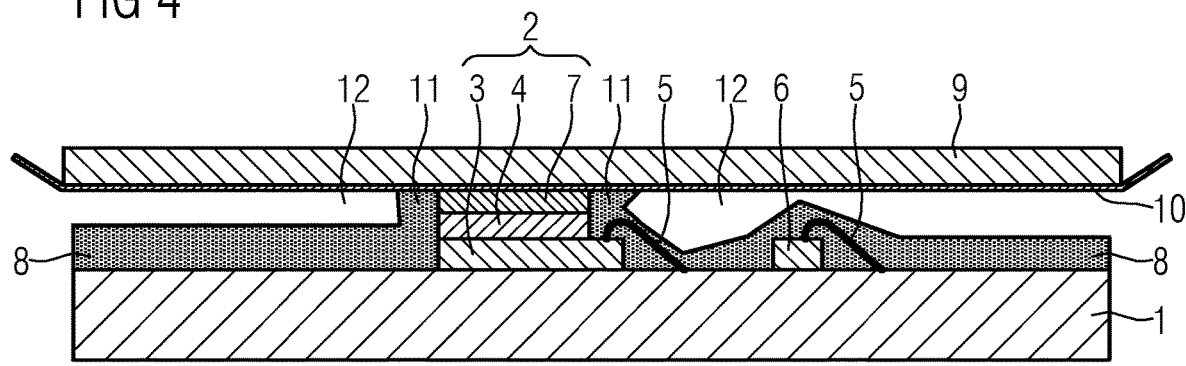

FIG. 4 shows a further method step, wherein a plate 9 comprising, for example, a film 10 on the entire underside is placed onto the protective layer 7 of the component 2. In this example, during the process of placing the plate 9 comprising the film 10, the first layer 8 is still in a soft state such that the first layer 8 is displaced laterally in the region of the protective layer 7 and, consequently, a top side of the protective layer 7 is substantially or completely freed of the first layer 8. The first layer 8 displaced from the top side of the protective layer 7 is displaced laterally into an edge region adjoining the protective layer 7 and adjoining the component 2. In this way, a frame 11 may form around the component 2 and around the protective layer 7, the frame being formed circumferentially around the protective layer 7 and the component 2. A top side of the protective layer 7 is free of the first layer 8. Depending on how much material of the first layer 8 is displaced laterally from the top side of the protective layer 7, the frame 11 may comprise a width which, proceeding from the carrier 1, increases in the direction of the plate 9. Laterally with respect to the frame 11, a free space 12 is formed between the plate 9 and the first layer 8 or between the film 10 and the first layer 8.

Figure 5:
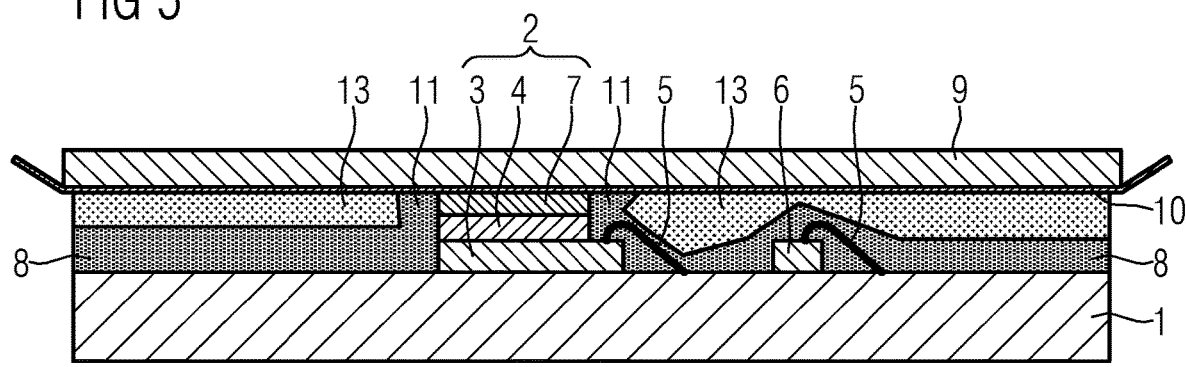

FIG. 5 shows a subsequent method step, wherein the free space 12 between the plate 9 or the film 10 and the first layer 8 has been filled with a second layer 13. By way of example, the second layer 13 may be introduced into the free space 12 with the aid of a mold method. The second layer 13 comprises a molding material comprising a greater hardness in the cured state than the first layer 8. Moreover, the second layer 13 comprises a lower optical density than the first layer 8. By way of example, a silicone-glass composite may be used as material for the second layer 13.

The second layer 13 may be constituted of a white or a black material. A black layer 13 has the advantage that scattered light is delimited to the region of the first layer since, in a black second layer 13, no electromagnetic radiation of the component may penetrate laterally into the second layer 13 or radiate through the second layer 13.

After being applied, the first and second layers are cured. In one example, the first layer and the second layer are cured in the film assisted mold process with a process temperature of approximately 150° C. It has proved to be advantageous, during the process of introducing the second layer 13 into the free space 12, for the first layer 8 still to be soft and adhesive for adhesive bonding to the second layer 13. By way of example, a Rockwell test method may be used for the hardness test. The second layer may comprise, for example, a hardness greater than the hardness of the first layer by at least 1%, in particular by 5% or by 10% or more. The second layer 13 additionally comprises a coefficient of expansion adapted to semiconductor materials.

Figure 6:
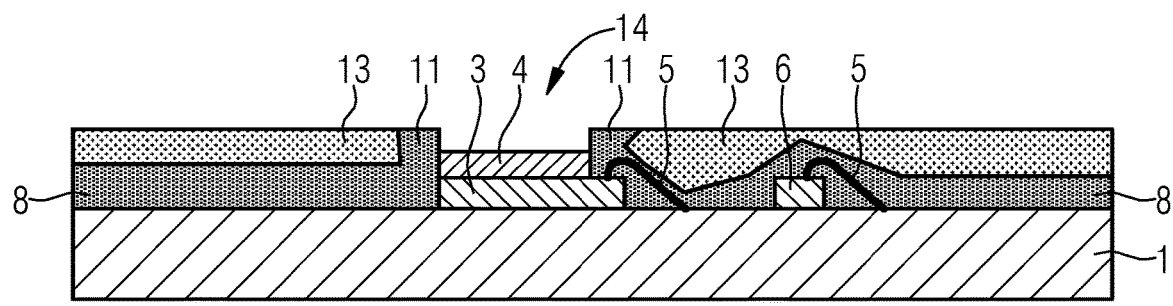

FIG. 6 shows a subsequent method step, wherein the plate 9 comprising the film 10 has been removed and the protective layer 7 has additionally been removed from the top side of the component 2, that is to say from the top side of the conversion element 4. The protective layer 7 may be removed with the aid of etching methods, for example. A second protective layer may be applied on the top side, the second protective layer protecting the arrangement visa vis environmental influences. A radiation surface 14 constituted by the top side of the component 2, that is to say by the top side of the conversion element 4, is surrounded laterally by the frame 11 comprising the first layer 8.

Figure 7:
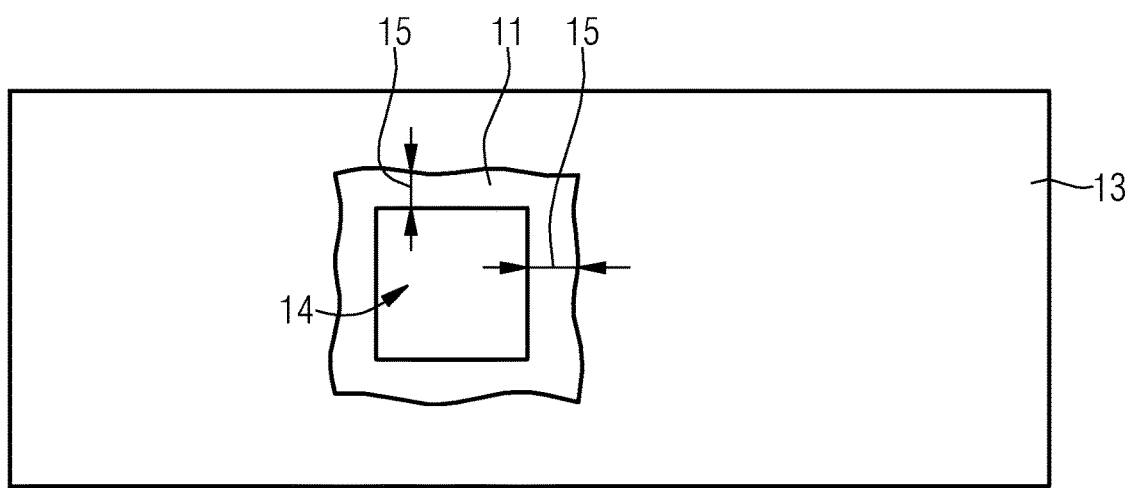

FIG. 7 shows a schematic plan view of the arrangement from FIG. 6. The frame 11 comprises, in the plane of the component 2, a width 15 that is 30 μm to 600 μm, in particular 100 μm to 300 μm. The circumferential frame 11 delimits the radiation surface 14 and, on account of the high optical density, provides for a precise delimitation of the emitted radiation to the region of the radiation surface 14.

The radiation surface 14 may finally be processed with the aid of a high-pressure waterjet with abrasive plastic beads such that the radiation surface is cleaned or roughened. Moreover, between the frame 11 and a side face of the radiation surface 14, that is to say a side face of the conversion element 4, a trench 16 may be formed with the aid of the high-pressure waterjet with abrasive plastic beads. An increased jump in refractive index between the conversion element and the surroundings is achieved as a result of the trench 16. The conversion element may comprise, for example, a refractive index of 1.8. The first layer 8 may comprise a refractive index of 1.5. The trench 16 comprises a refractive index of 1. The contrast between the radiation surface 14 and the frame 11 may furthermore be increased with the aid of the trench 16.

A bright-dark contrast between the interface of the radiation surface 14 and the surroundings is increased with the aid of the frame 11 constituted of the first layer 8 comprising a great optical density. Moreover, a housing material that affords good protection may be provided with the aid of the robust second layer 13 consisting of a silicone mold compound, for example. To fill the free spaces 12, it is possible to use a high-pressure injection molding method, for example, with a film assisted method.

The top side of the protective layer 7 may be freed of the first layer 8 by a milling process, grinding process or a cutting method.

FIGS. 8 to 13 show method steps analogous to FIGS. 1 to 7, but the protective layer 7 was dispensed with in this example. The other method steps remained the same. In this example, the frame 11 ends on the top side of the conversion element 4, as is clearly discernible with reference to FIG. 12. Consequently, in this example, the frame 11 does not project beyond the top side of the conversion element 4. If no conversion element 4 is provided, then the frame 11 does not project beyond the top side of the semiconductor chip 3. In this example, however, the semiconductor chip 3 is contacted via the underside or the contact wires do not project beyond the top side of the semiconductor chip 3.

Figure 14:
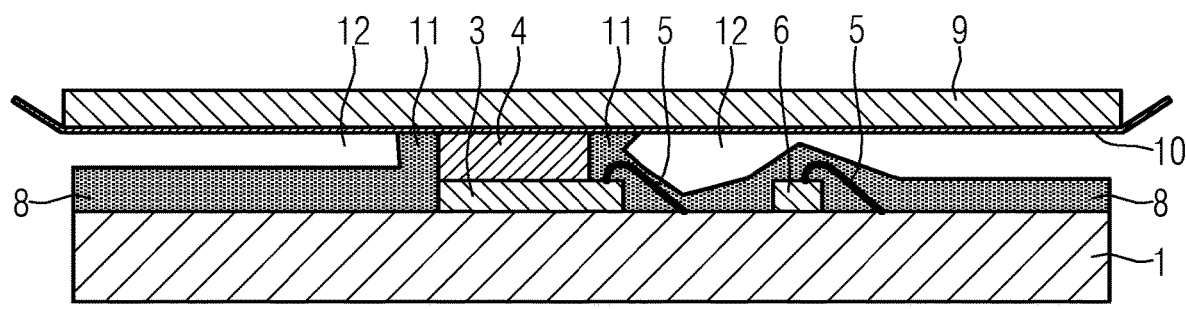
FIG. 14 shows a schematic cross-section through a further method step of producing a lighting device.

FIG. 14 shows a schematic cross section through an arrangement of the carrier 1 with the component 2, wherein the first layer 8 was applied on the component 2 and the carrier 1. In addition, before placing the plate 9 comprising the film 10, the first layer 8 was removed from the top side of the conversion element 4. A protective layer 7 may also be arranged on the top side of the conversion element 4. Since the first layer 8 was removed from the top side of the conversion element 4 before placing the plate 9, the frame 11 comprises an approximately constant width in the direction of the plate 9. The width of the frame 11 may also decrease somewhat in width in the direction of the plate 9. Consequently, with this method, lighting devices may be produced, wherein the frame 11 comprises a constant width or a decreasing width in the direction of a top side of the component 2.

Figure 15:
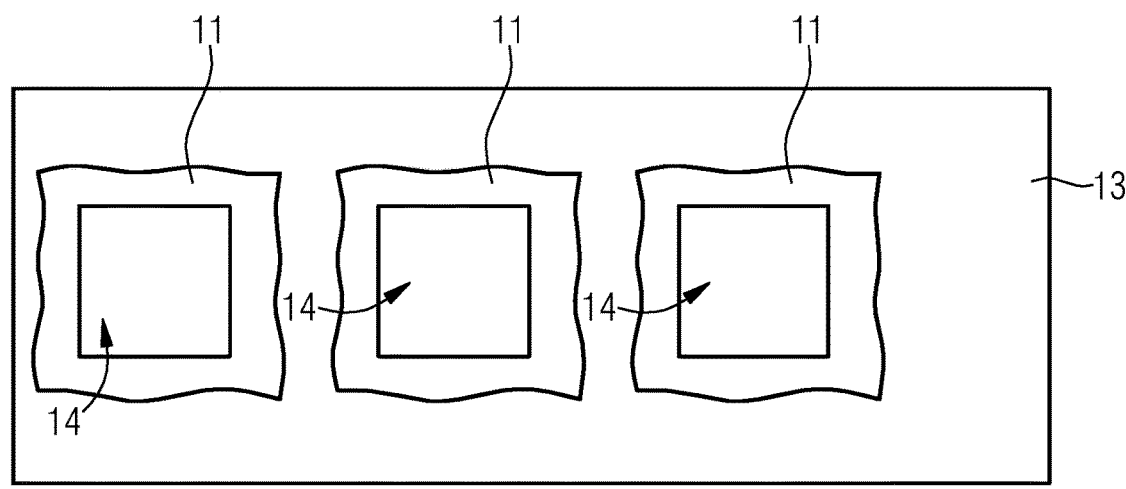
FIG. 15 shows a schematic plan view of a carrier with a plurality of lighting devices.

FIG. 15 shows, in a schematic illustration, a lighting device comprising a carrier 1 on which a plurality of components comprising radiation surfaces 14 are arranged, wherein the arrangement was produced in accordance with one of the methods described.

In these examples, too, the radiation surfaces 14 of the components are provided with the frames 11 such that a lateral widening of the radiation surface 14 is minimized.

Figure 16:
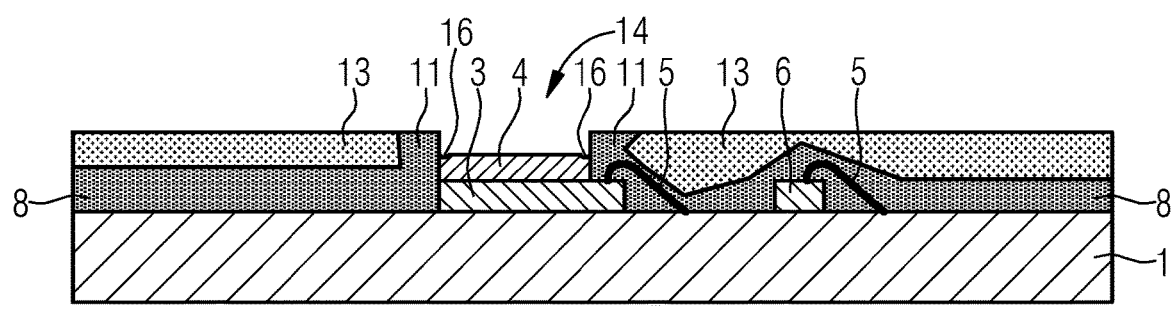
FIGS. 16 and 17 show schematic illustrations of a further example of a lighting device.

FIG. 16 shows a schematic cross section through one example of a lighting device, wherein a circumferential trench 16 was introduced into the edge region between the conversion element 4 and the frame 11.

Figure 17:
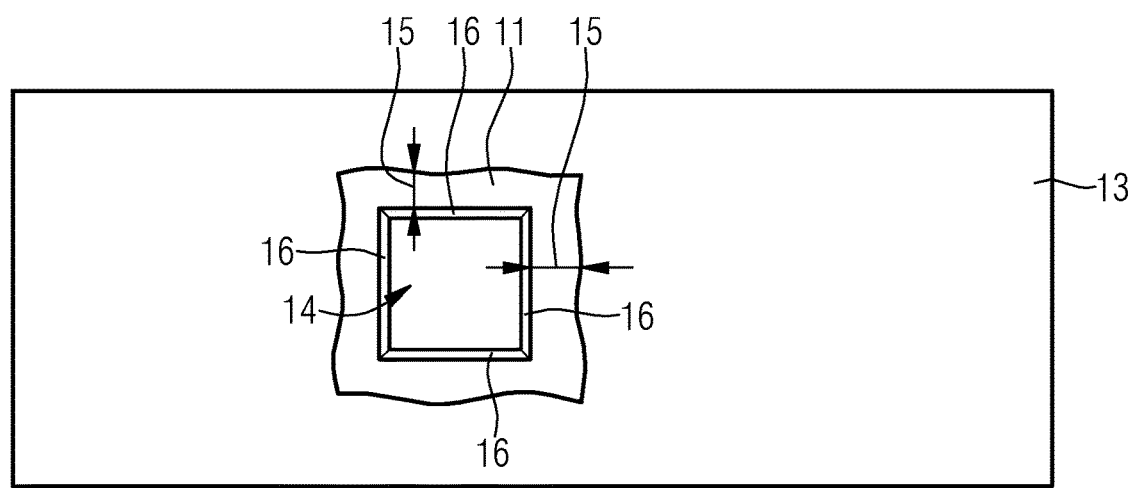

FIG. 17 shows a plan view of the arrangement from FIG. 16 in schematic illustration.

Figure 18:
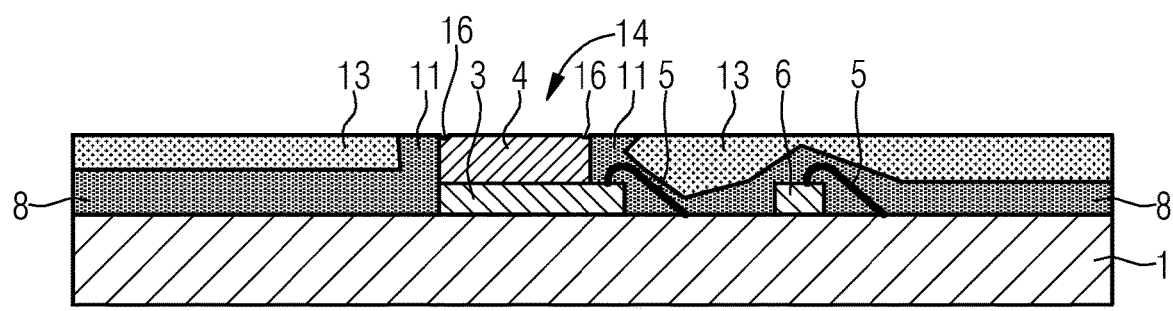
FIGS. 18 and 19 show schematic illustrations of a further example of a lighting device.

FIG. 18 shows a further example of a lighting device, wherein the frame 11 terminates with the top side of the conversion element 4 and in addition a circumferential trench 16 was introduced into the edge region between the conversion element 4 and the frame 11.

Figure 19:
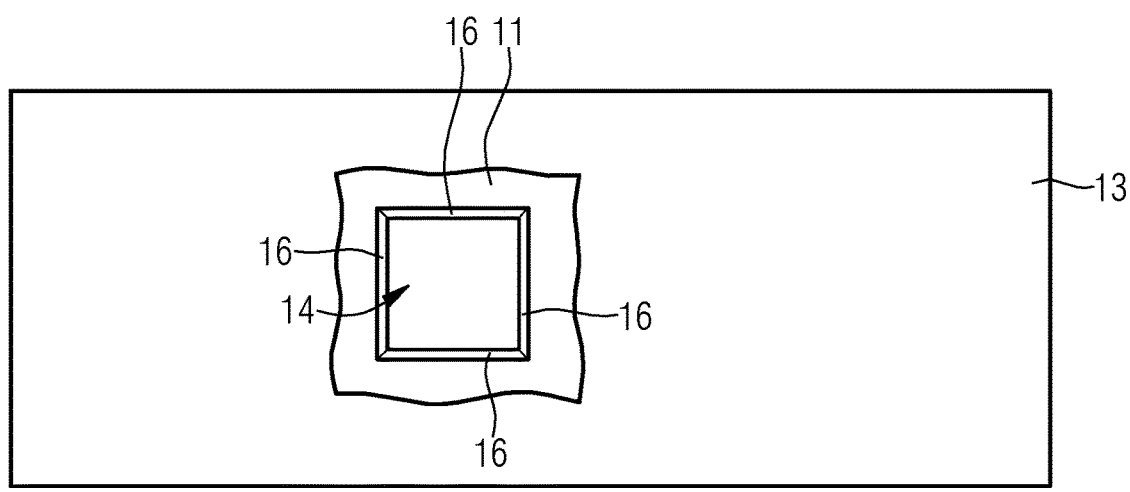

FIG. 19 shows a schematic plan view of the arrangement from FIG. 18.

FIGS. 20 to 26 show method steps of a further method of producing a lighting device.

Figure 8:
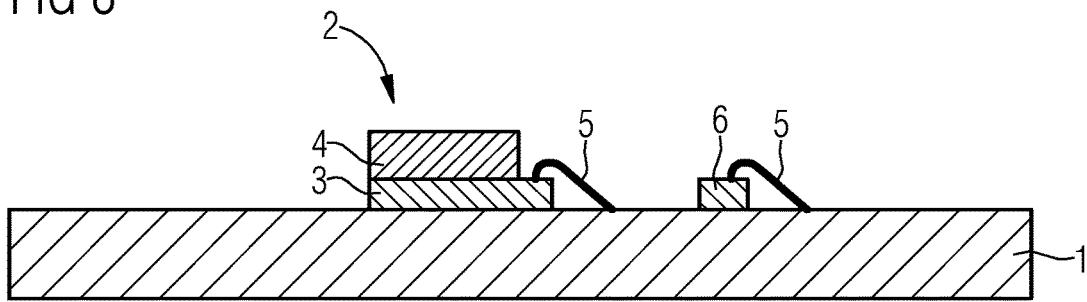
FIGS. 8 to 13 show a second method of producing a lighting device.
Figure 9:
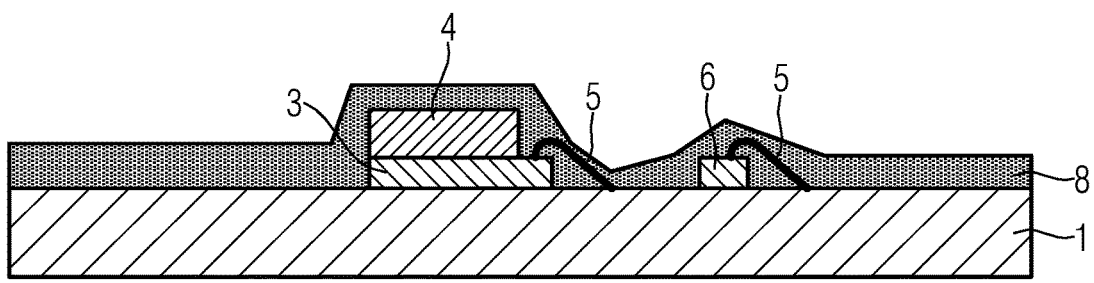
Figure 10:
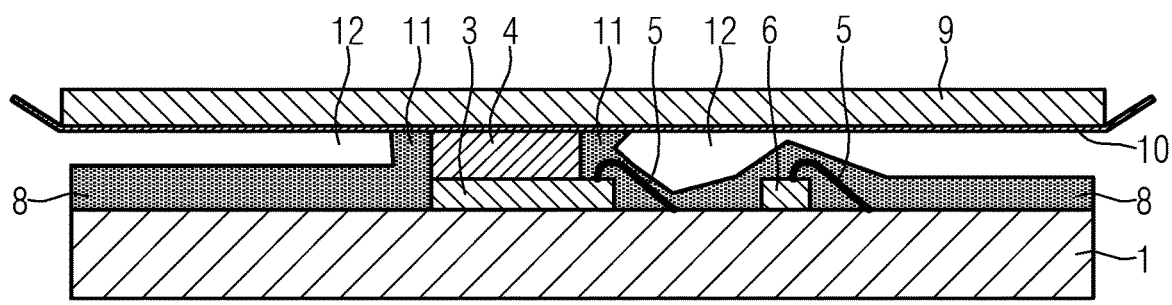
Figure 11:
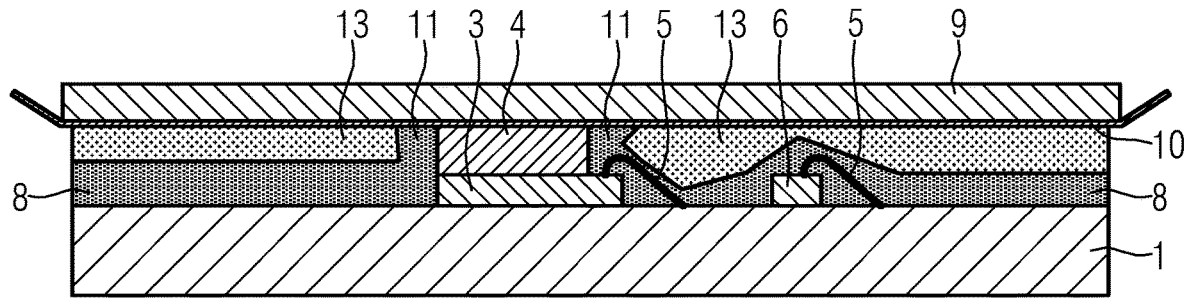
Figure 12:
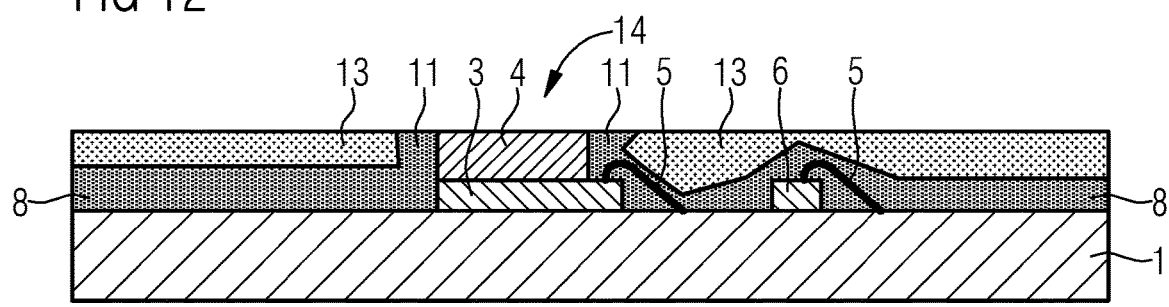
Figure 13:
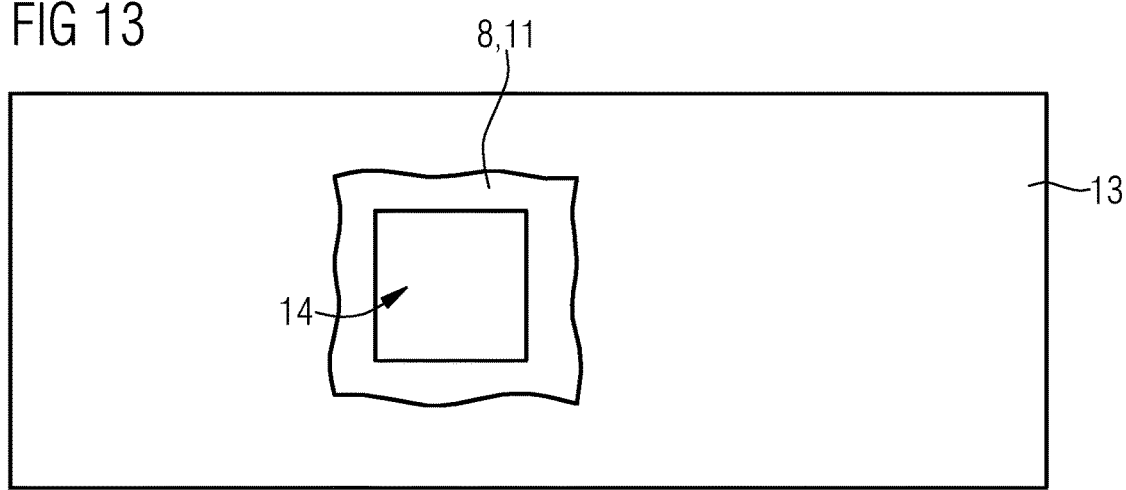
Figure 20:
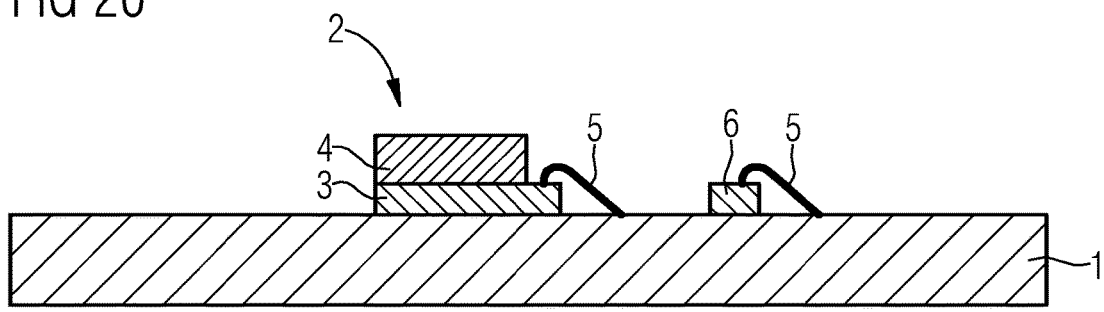
FIGS. 20 to 26 show method steps of a third method of producing a lighting device.
Figure 21:
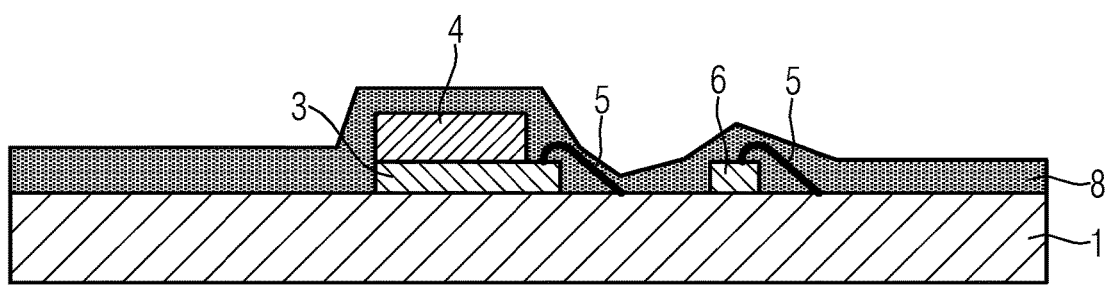
Figure 22:
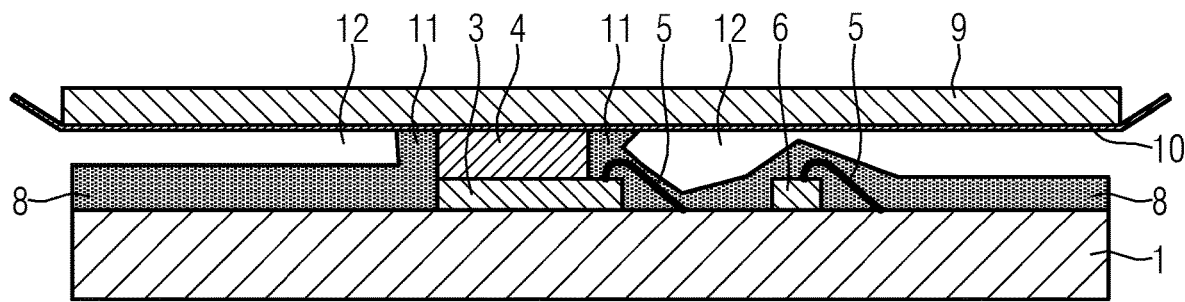

FIGS. 20 to 22 correspond to the method steps from FIGS. 8 to 10. To avoid repetition, reference is made to the description of FIGS. 8 to 10.

Figure 23:
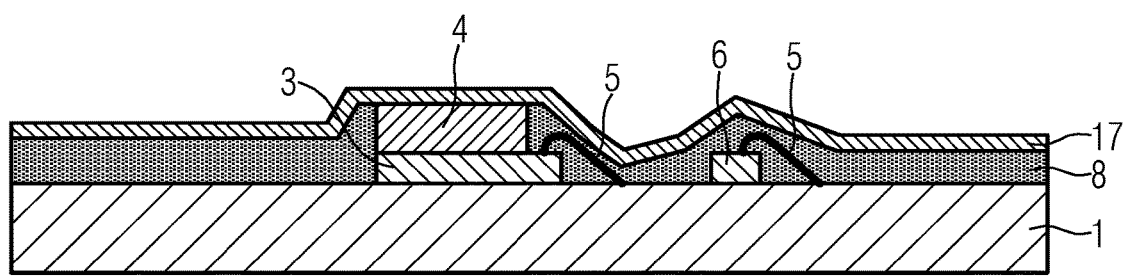

After carrying out the method step in FIG. 22 and after removing the plate 9 and the film 10, in a further method step illustrated in FIG. 23, a third layer 17 is applied over the whole area on the top side of the conversion element 4 and on the top side of the first layer 8. The third layer 17 is constituted, e.g., of a material nontransmissive to the electromagnetic radiation of the component, in particular from a black material. By way of example, the third layer 17 may be constituted from a black silicone, a black epoxy material or a black plastics material. The third layer 17 may be applied by a spray method, a casting method or a printing method, in particular by a screen printing method.

Figure 24:
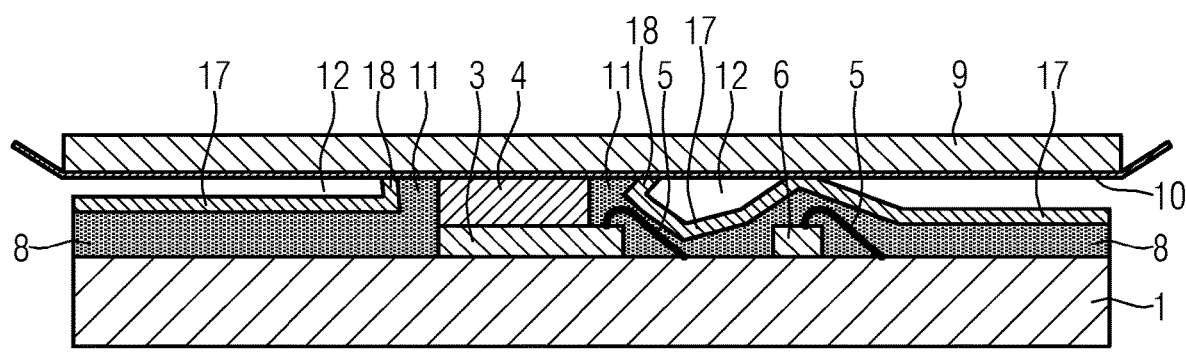

After applying the third layer 17, as illustrated in FIG. 24, analogously to FIG. 10, with the aid of a plate 9 comprising, for example, a film 10 on the entire underside, the material of the third layer 17 is displaced in a lateral direction from the top side of the conversion element 4 and from the frame 11 into a region laterally next to the frame 11. The frame 11 circumferentially surrounds the conversion element 4. The frame 11 extends as far as a level of a top side of the conversion element. The frame 11 is constituted of the first layer 8. The material of the third layer 17 displaced from the top side of the conversion element 4 and from the top side of the frame 11 of the first layer 8 is displaced laterally into an edge region adjoining the frame 11. In this way, a second frame 18 is constituted of the material of the third layer 17. The second frame 18 circumferentially surrounds the frame 11. The second frame 18 extends up to a level of the top side of the frame 11. Consequently, the top side of the frame 11, the top side of the second frame 18 and the top side of the conversion element 4 are arranged at the same level.

Figure 25:
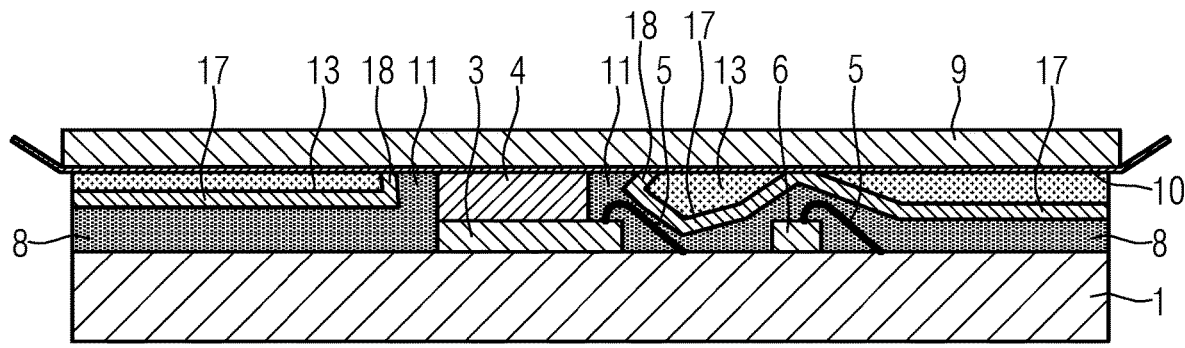

Afterward, as illustrated in FIG. 25, a free space 12 between the plate 9 and the third layer 17 or between the film 10 and the third layer 17 is filled with a second layer 13. By way of example, the second layer 13 may be introduced into the free space 12 with the aid of a mold method. The second layer 13 comprises a molding material comprising a greater hardness in the cured state than the first layer 8. By way of example, a Rockwell test method may be used for the hardness test. The second layer may comprise, for example, a hardness greater than the hardness of the first layer by at least 1%, in particular by 5% or by 10% or more. Moreover, the second layer 13 may comprise a lower optical density than the first layer 8. By way of example, a silicone-glass composite may be used as material for the second layer 13.

The first, second and third layers are subsequently cured. In one example, the first layer and the second layer and the third layer are cured at a process temperature of 150° C. It has proved to be expedient, during the process of introducing the second layer 13 into the free space 12, for the third layer 17 still to be soft and adhesive for adhesive bonding to the second layer 13. Moreover, the second layer may comprise a coefficient of expansion adapted to semiconductor materials.

Figure 26:
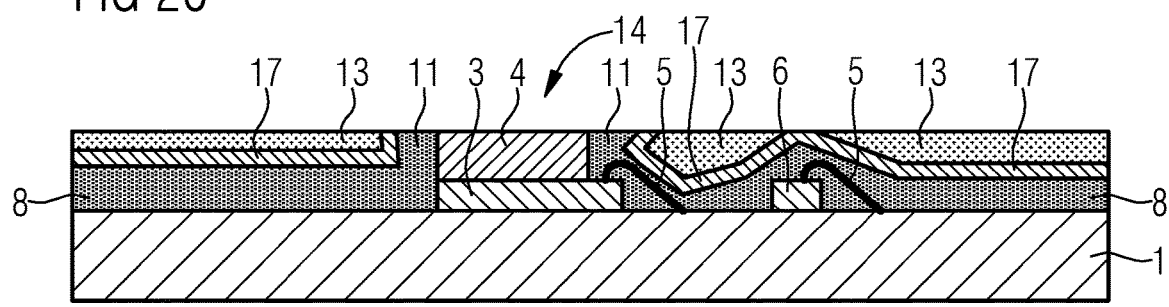

FIG. 26 shows a subsequent method step, wherein the plate 9 and the film 10 were removed.

In the method steps in accordance with FIGS. 20 to 26, in addition to the conversion element 4, a protective layer 7 may also be arranged on the conversion element 4, as was described in the method steps in accordance with FIGS. 1 to 5. At the end of the process, the protective layer 7, if present, is removed, as was explained with reference to FIG. 6.

Figure 27:
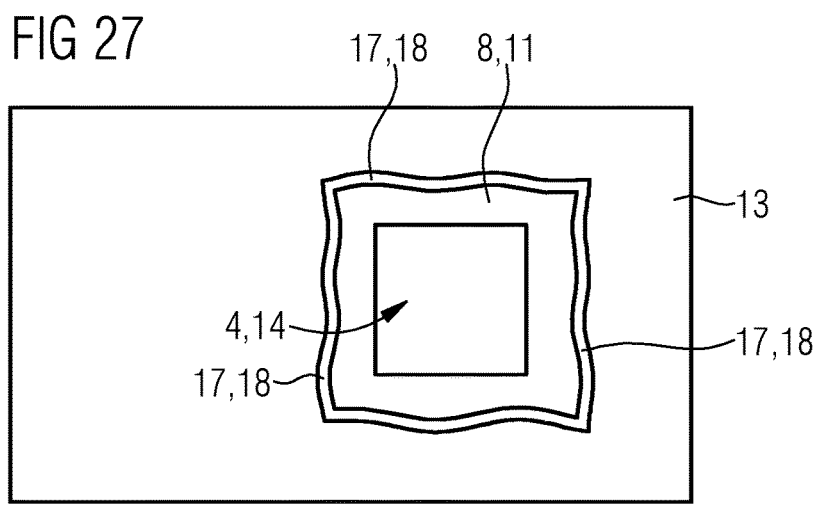
FIG. 27 shows a plan view of a lighting device which was produced in accordance with the third method.

FIG. 27 shows a plan view of the arrangement from FIG. 26, illustrating a lighting device. The radiation surface 14 of the conversion element 4 is surrounded by the frame 11. The frame 11 may comprise a width in the region of the component 2, in particular in a plane of the top side of the conversion element 4, that is to say comprise a width in the plane of the radiation surface 14, which is 30 µm to 600 µm, in particular 100 µm to 300 µm. The circumferential frame 11 delimits the radiation surface. The frame 11 is delimited circumferentially by the second frame 18. The second frame 18 may comprise in the plane of the radiation surface 14 a width 30 µm to 600 µm or more. In particular, the width of the second frame 18 may be 100 µm to 300 µm.

The material of the third layer 17 may comprise a higher optical density than the material of the first layer 8. Consequently, the second frame 18 comprises a higher optical density than the frame 11. A precise delimitation of the radiating surface to the radiation surface 14 and the frame 11 is achieved as a result. As a result of the frame 11 laterally surrounding the conversion element 4, lateral scattered light may also additionally be emitted in the radiation direction laterally with respect to the radiation surface 14. With the aid of the second frame 18, the lateral propagation of the electromagnetic radiation of the component 2 is further hampered or blocked at the second frame 18 depending on the material of the third layer. It is thus possible to achieve a high contrast, that is to say a precise delimitation of the radiating surface to the outer boundary of the frame 11. Consequently, the second layer 13 may be constituted of an arbitrarily colored and radiation-transmissive material, in particular from a white or black material. In the example in FIG. 27, the third layer 17 with the aid of the second frame 18 may bring about a precise delimitation of the radiating surface via which the electromagnetic radiation of the component 2 is emitted. The material of the third layer 17 may comprise a higher optical density than the material of the second layer 13.

Our methods and devices have been illustrated and described in greater detail on the basis of preferred examples. Nevertheless, this disclosure is not restricted to the examples disclosed. Rather, other variations may be derived therefrom by those skilled in the art, without departing from the scope of protection of the appended claims.

The invention claimed is:

1. A method of producing a lighting device comprising a radiation-emitting optoelectronic component, comprising:
    arranging the radiation-emitting optoelectronic component on a carrier,
    applying a first layer on the carrier, wherein the first layer surrounds the radiation-emitting optoelectronic component at least laterally in the form of a circumferential frame, and subsequently applying a second layer on the first layer laterally next to the circumferential frame, wherein the second layer comprises a greater hardness than the first layer.

2. The method according to claim 1, wherein before applying the second layer, a third layer is applied on the first layer, the third layer surrounds the circumferential frame of the first layer at least laterally in the form of a second circumferential frame, the second layer is subsequently applied on the third layer laterally next to the second circumferential frame, and the third layer comprises a material less transmissive to the electromagnetic radiation of the radiation-emitting optoelectronic component than the material of the first layer.

3. The method according to claim 1, wherein after applying the first layer, a plate is placed onto the radiation-emitting optoelectronic component, and an interspace between the plate and the first layer is filled with a molding material with the aid of a mold method and the second layer is formed.

4. The method according to claim 2, wherein after applying the third layer, a plate is placed onto the radiation-emitting optoelectronic component, and an interspace between the plate and the third layer is filled with a molding material with the aid of a mold method and the second layer is formed.

5. The method according to claim 1, wherein before applying the first layer, a protective layer is applied on a top side of the radiation-emitting optoelectronic component, and the first layer is subsequently applied.

6. The method according to claim 3, wherein the first layer is applied on a top side of the radiation-emitting optoelectronic component or on a top side of a protective layer that is deposited on a top side of the radiation-emitting optoelectronic component, and as a result of placing the plate, the first layer is displaced from the top side of the radiation-emitting optoelectronic component or from the top side of the protective layer at least partly into an edge region next to the top side of the radiation-emitting optoelectronic component or next to the protective layer.

7. The method according to claim 3, wherein the first layer is also applied on a top side of the radiation-emitting optoelectronic component or on a top side of a protective layer that is deposited on a top side of the radiation-emitting optoelectronic component, and the first layer is at least partly removed from the top side of the radiation-emitting optoelectronic component or from the top side of the protective layer with the aid of a grinding process, a milling process or a cutting process.

8. The method according to claim 1, wherein the third layer is applied on a top side of the radiation-emitting optoelectronic component or on a top side of a protective layer that is deposited on a top side of the radiation-emitting optoelectronic component and at least on a circumferential frame of the first layer, and as a result of placing the plate, material of the third layer is displaced from the top side of the radiation-emitting optoelectronic component or from the top side of the protective layer and from the top side of the circumferential frame of the first layer at least partly into an edge region laterally next to the circumferential frame of the first layer and a second circumferential frame is constituted of the material of the third layer.

9. The method according to claim 1, wherein the third layer is applied on a top side of the radiation-emitting optoelectronic component or on a top side of a protective layer that is deposited on a top side of the radiation-emitting optoelectronic component and on a circumferential frame of the first layer, and the second layer is at least partly removed from the top side of the radiation-emitting optoelectronic component or from the top side of the protective layer and from the top side of the circumferential frame of the first layer with the aid of a grinding process, a milling process or a cutting process.

10. The method according to claim 1, wherein the radiation-emitting optoelectronic component comprises a semiconductor chip and a conversion element, and the conversion element is arranged on the semiconductor chip and constitutes at least one part of the top side of the radiation-emitting optoelectronic component.

11. The method according to claim 1, wherein the first layer and/or the second layer comprise(s) a thickness of 30 $\mu$m to 600 $\mu$m.

12. The method according to claim 1, wherein the first layer comprises a matrix material or a silicone, and scattering particles, and the second layer comprises a mold material.

13. The method according to claim 1, wherein the radiation-emitting optoelectronic component comprises a semiconductor chip, wherein at least in a circumferential frame edge region adjoining the top side of the semiconductor chip, a trench is introduced into the first layer.

14. A lighting device comprising a radiation-emitting optoelectronic component, wherein the radiation-emitting optoelectronic component is arranged on a carrier, a first layer is arranged on the carrier, the first layer surrounds the radiation-emitting optoelectronic component as far as a top side of the radiation-emitting optoelectronic component in the form of a circumferential frame, a second layer is arranged laterally with respect to the circumferential frame on the first layer, and the second layer comprises a greater hardness than the first layer.

15. The lighting device according to claim 14, wherein the circumferential frame projects from the first layer beyond a top side of the radiation-emitting optoelectronic component.

16. The lighting device according to claim 14, wherein the first layer comprises a matrix material and scattering particles, wherein the second layer comprises a mold material.

17. The lighting device according to claim 14, wherein the radiation-emitting optoelectronic component comprises a semiconductor chip with a conversion element.

18. The lighting device according to claim 14, wherein the circumferential frame comprises a width in a plane of the top side of the radiation-emitting optoelectronic component of 50 $\mu$m to 600 $\mu$m.

19. The lighting device according to claim 14, wherein the circumferential frame is surrounded by a second circumferential frame of a third layer, and the third layer comprises a material less transmissive to the electromagnetic radiation of the radiation-emitting optoelectronic component than the material of the first layer.

20. The lighting device according to claim 14, wherein the first layer comprises a greater optical density than the second layer.

* * * * *